United States Patent
Buchmann

(10) Patent No.: US 7,382,634 B2
(45) Date of Patent: Jun. 3, 2008

(54) VOLTAGE MULTIPLIER WITH CHARGE RECOVERY

(75) Inventor: Michael Buchmann, Duisberg (DE)

(73) Assignee: Nokia Corporation, Espoo (FI)

( * ) Notice: Subject to any disclaimer, the term of this patent is extended or adjusted under 35 U.S.C. 154(b) by 488 days.

(21) Appl. No.: 10/691,252

(22) Filed: Oct. 22, 2003

(65) Prior Publication Data
US 2004/0080964 A1  Apr. 29, 2004

(30) Foreign Application Priority Data
Oct. 25, 2002   (FI)   ................................. 20021905

(51) Int. Cl.
*H02M 3/18*   (2006.01)
*H02M 7/00*   (2006.01)
*H02M 7/19*   (2006.01)

(52) U.S. Cl. .......................... 363/59; 363/60; 307/109; 307/110; 327/536

(58) Field of Classification Search ................. 363/59, 363/60; 307/109, 110; 327/536
See application file for complete search history.

(56) References Cited

U.S. PATENT DOCUMENTS

| | | | | |
|---|---|---|---|---|
| 4,016,476 A | * | 4/1977 | Morokawa et al. | 363/60 |
| 4,236,199 A | * | 11/1980 | Stewart | 363/60 |
| 4,992,719 A | * | 2/1991 | Harvey | 363/59 |
| 5,006,974 A | * | 4/1991 | Kazerounian et al. | 363/60 |
| 5,043,858 A | * | 8/1991 | Watanabe | 363/61 |
| 5,280,420 A | * | 1/1994 | Rapp | 363/60 |
| 5,574,634 A | * | 11/1996 | Parlour et al. | 363/59 |
| 5,625,544 A | * | 4/1997 | Kowshik et al. | 363/59 |
| 5,856,918 A | * | 1/1999 | Soneda et al. | 363/60 |
| 5,907,484 A | * | 5/1999 | Kowshik et al. | 363/60 |
| 5,926,059 A | * | 7/1999 | Brani et al. | 327/536 |
| 5,994,949 A | * | 11/1999 | Menichelli | 327/536 |
| 6,046,625 A | * | 4/2000 | Menichelli | 327/536 |

(Continued)

FOREIGN PATENT DOCUMENTS

EP   0461717 A1   12/1991

(Continued)

OTHER PUBLICATIONS

Patent Abstracts of Japan (EPO), JP10285797, Sonoda Keiki Kogyo KK.

(Continued)

*Primary Examiner*—Bao Q. Vu
(74) *Attorney, Agent, or Firm*—Harrington & Smith, PC

(57) ABSTRACT

Capacitive voltage multiplier for generating voltage pulses, preferably up to 100 V, that are higher than the supply voltage for displays, non-volatile memories and corresponding units especially in small electronic devices, such as handheld telecommunication terminals or corresponding devices, wherein the multiplier comprises a switching capacitor circuit (21) provided with capacitors and switches for charging the capacitors in parallel and discharging them in series in order to deliver a high voltage pulse. The multiplier further comprises a diode chain circuit (22) consisting of a diode-chain and pumping capacitors for delivering high voltage current. The inventive system allows the output high voltage to be switched on and held with little longtime drop and with small switching losses and able to supply a load current without significant ripple. Additionally switching the high voltage on and off does not result in efficiency loss.

8 Claims, 3 Drawing Sheets

U.S. PATENT DOCUMENTS

| | | | | |
|---|---|---|---|---|
| 6,055,161 | A * | 4/2000 | Church et al. | 363/22 |
| 6,304,007 | B1 * | 10/2001 | Yu | 307/110 |
| 6,710,773 | B2 * | 3/2004 | Jenkins et al. | 345/211 |
| 6,781,440 | B2 * | 8/2004 | Huang | 327/537 |
| 6,825,715 | B2 * | 11/2004 | Andle | 329/370 |

FOREIGN PATENT DOCUMENTS

| | | |
|---|---|---|
| EP | 0720170 A2 | 7/1996 |
| WO | WO-99/56383 A1 | 4/1999 |

OTHER PUBLICATIONS

Patent Abstracts of Japan (EPO), JP2001086657, Casio Comput Co., Ltd.

P.E.K. Donaldson, "The Mosmarx Voltage Multiplier", Electronics & Wireless World, Aug. 1988, pp. 748-750.

"Stepping Out-Ian Hegglun's new voltage multiplier promises higher efficiency and simpler implementations", Electronics World, Oct. 1996, Analogue Design, pp. 795-797, 805-806.

Sang-Kyoo Hau et al., "Energy-Recovery Circuit for Plasma Display Panel", Electronics Letters, Jul. 18, 2002, vol. 38, No. 15, pp. 790-791.

* cited by examiner

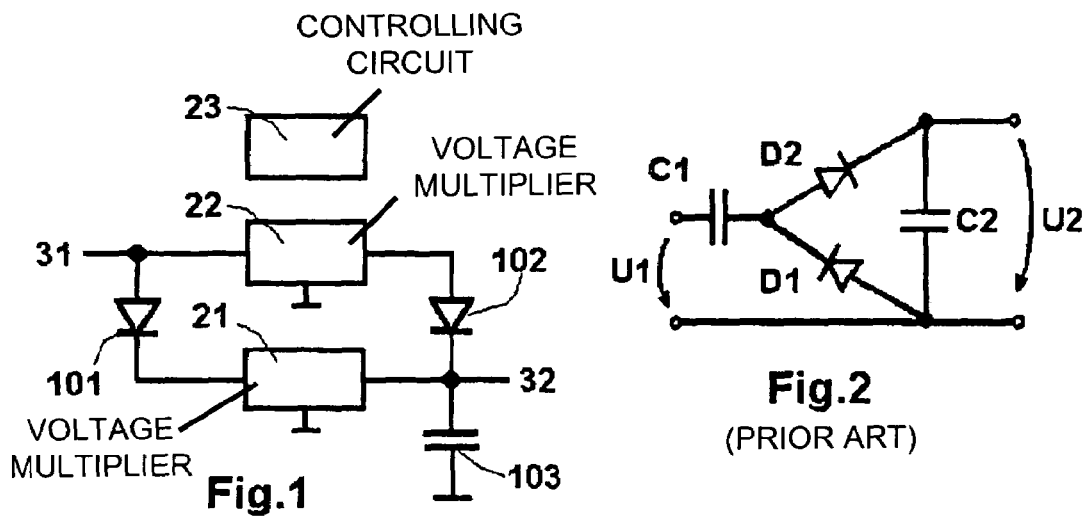
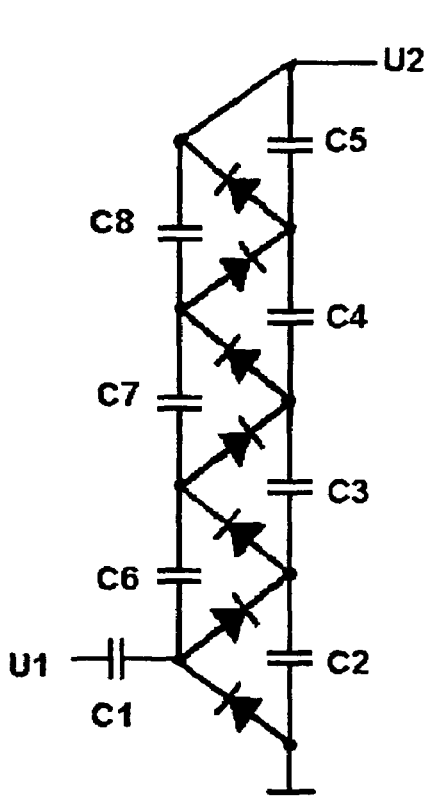
Fig.3
(PRIOR ART)
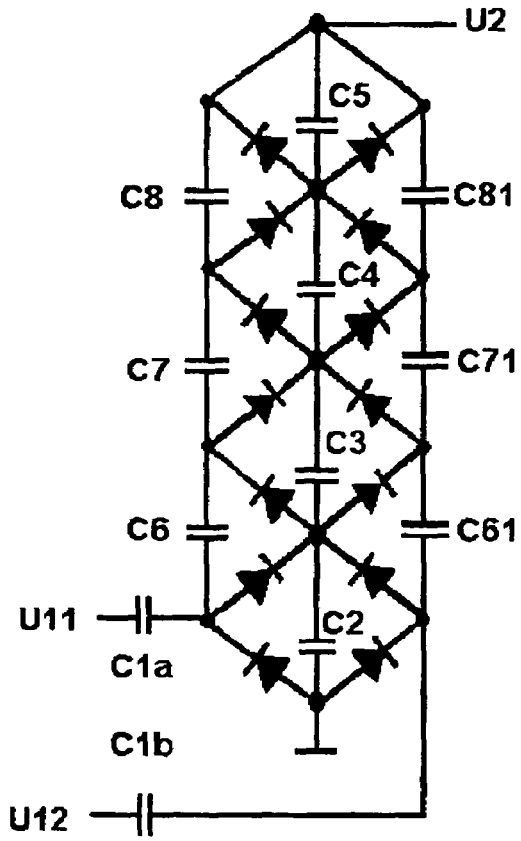
Fig.4
(PRIOR ART)

VOLTAGE MULTIPLIER WITH CHARGE RECOVERY

FIELD OF INVENTION

The present invention relates to voltage multipliers for generating voltage pulses that are higher than the supply voltage, and more particularly to capacitive voltage multipliers for generating voltage pulses, up to 100 V, for displays, non-volatile memories and corresponding units in small electronic devices, such as handheld telecommunication or corresponding terminals.

BACKGROUND OF THE INVENTION

Voltage multiplying circuits use either capacitive or inductive phenomena to step up an input voltage. Even the recently introduced piezoelectric step-up transformers use piezo-capacitive phenomena to generate stepped up output voltage. Inductive and piezoelectric voltage multipliers are for size and weight reasons not practical for high voltage generation in handheld terminals. For use with integrated circuitry capacitive muliplyers are the preferred choice.

Basically two types of on-chip circuits are known that generate pulses higher than the supply voltage: diode chain multiplier and parallel/serial switching of capacitors.

The parallel/serial capacitive multiplying circuits are principally based on the Ervin Marx multiplier, where capacitors are charged in parallell and discharged in series. Although widely used in high voltage high power pulse applications, this kind of store and stack system has drawbacks, especially when a steady level high voltage is needed, because the stack will discharge and the output voltage will drop after the initial pulse. In the original form the switching was done with the help of sparkgaps which all will all break down substantially simultaneously because the voltage will increase over the remaining sparkgaps when the first sparkgap triggers or is triggered. Instead of sparkgaps, for lower voltages controlled switches can be used instead. An example of an improved variant of the Marx multiplier called the Mosmarx multiplier was given by P. E. K. Donaldsen: "The Mosmarx voltage multiplier", Electronics & Wireless World, August 1988, pages 748-750. Here metal oxide semiconductors (MOS) switches were used instead of spark gaps. When continuous output is needed high voltage charge is stored in a separate reservoir capacitor, isolated by a serial diode from the output stage, and the switches are operated continuously. The continuous operation prevents the use of micromechanical (MEMS) switches which have a limited lifetime and/or operating frequency.

Most high voltage generators are typically feeding into a reservoir capacitor. When a high voltage pulse is created, it charges the capacitor with energy taken from the supply. When the high voltage pulse is to be terminated, the charge on the output capacitor is normally discharged to ground on the falling edge of the pulse and all the energy in the capacitor is lost. This loss is proportional to the reservoir capacitance, but too low a capacitance will cause output voltage ripple. For pulsed use it would however be energy efficient if the output capacitance would be small and mainly consist for example of the parasitic capacitance of a display device.

The other common voltage multiplying circuit is based on cascaded diode pumps. Such multipliers are based on chained voltage multipliers, using the simple two diode D1, D2 voltage doubling stage coupled to the driving voltage waveform input U1 via a capacitor C1 illustrated in FIG. 2. In this doubling stage the output voltage U2 over a capacitor C2 is twice the input voltage U1 for a rectangular driving pulse and 2.82 times the RMS value of a sinusoidal U1 driving waveform, if the voltage drop over the diodes is disregarded.

When cascaded, such simple voltage multipliers will form the well known Cockcroft-Walton multiplier chain, popularized by John Cockcroft and Ernest Walton, and illustrated in FIG. 3, wherein the chain consists of capacitors C1 to C8 and diodes in a known manner.

In order to increase the efficiency and to reduce the output ripple the multiplier according to FIG. 3 can be doubled to form a push pull multiplier, illustrated in FIG. 4. This multiplier can be considered as two separate Cockcroft-Walton multiplier diode chains provided with diodes and capacitors C6 to C8 and C61 to C81, charging a common reservoir capacitor chain, C2, C3, C4 and C5, and the two voltage multiplier chains are each driven by respective phase shifted inputs U11 and U12 via capacitors C1a, C1b. Each cascaded diode multiplier chain need only supply half the current and the output ripple will be reduced because of the increased frequency of the charging action even if the reservoir capacitor chain C2, C3, C4 and C5 is of the same size as in FIG. 3. In the same way other multi phase multipliers can be envisaged.

FIG. 5 shows the same multiplier as FIG. 4, with the phased input signals U11 and U12 via capacitors C1a and C1b and the output to U2 through the diodes D7a and D7b and smoothed by C5, which is at the top of the reservoir capacitor chain. FIG. 5 can be simplified to a also previously known split type multiplier according to FIG. 6 by removing the reservoir capacitor chain and connecting the anode of each step-up diode directly to the cathode of the next stage step-up diode. Because two serially connected diodes are now replaced with a single diode this can be done with little or no efficiency loss. Another advantage of the circuit of FIG. 6 that can be used to advantage in the present invention is the capacitor free output, because U2 is fed through the diodes D7a and D7b without a reservoir capacitor. This is more clearly illustrated in by FIG. 7, which is actually FIG. 6 redrawn in a more common form.

FIG. 8 illustrates how a multiplier can be connected to boost a supply voltage Udc. The output voltage will be increased by the same amount as the supply voltage itself. The previous examples in FIG. 2 to FIG. 7 were drawn as ground referenced, but could use this method as well.

FIG. 9 illustrates how the a voltage multiplier diode chain can be arranged by driving the capacitors in parallell by U11 respectively U12. To drive the capacitors in parallel is more efficient than driving them through previous stages. This is a efficient and parts count reducing method that can be used whenever the generated voltages are within the capacity of the circuitry.

FIGS. 2 to 9 have illustrated various known multipliers using diode chains as switches. The earlier mentioned series/parallel Marx multiplier uses switches and not diodes, and a typical Marx multiplier is depicted in FIGS. 10a and 10b, where FIG. 10a shows the charging in parallel of C1, C2, C3 and C4 from U1 using the even numbered switches S2, S4, S6, S8, S10 and S12 and FIG. 10b shows the high voltage output phase when the even numbered switches are opened and the odd numbered switches S1, S3 and S5 are engaged to connect the charged capacitors in series in order to generate the high output voltage U2. Any outside load capacitance will be connected in parallel with C1, C2, C3 and C4 in the charging phase. The diode D101 prevents the generated high voltage 32 to be leaked back into the supply 31 during the high voltage output pulse and does the same also in the charging phase if the capacitor voltage because of charge charing is higher than the supply voltage.

In many applications a high-voltage source is needed that can be switched on and off rapidly without loosing energy and without the use of a high-voltage output switch, which is difficult to implement.

Using a serial/parallel multiplier with a reservoir capacitor output would need such high-voltage switch or else the reservoir charge would need to be bled-off every time. Charging the reservoir capacitor and then bleeding off the charge when there is no need for high voltage decreases efficiency.

Using a serial/parallel multiplier without a diode fed reservoir capacitor will however limit the length of a high-voltage pulse in single pulse use and in continuous use it will result in excessive ripple.

A diode chain multiplier will also need a high voltage output switch in order to preserve efficiency when high voltage is needed intermittently, like for example in handheld terminals. In handheld terminals, where efficiency is of paramount concern, the display is using high voltage only when active, and is typically switched on and off intermittently.

SUMMARY OF THE INVENTION

The object of the present invention is to eliminate the disadvantages of the prior art and to provide a system that allows the output high voltage to be switched on and held with little longtime drop and small switching losses and able to supply a load current without significant ripple. Additionally switching the high voltage on and off does not result in efficiency loss.

The present invention is based on combining a serial/parallel multiplier circuit (Marx) and a diode chain multiplier circuit (Walton-Cockroft) in a new modified circuit in order to reduce the total power consumption of the pulse generator. For example a MOS Marx multiplier can be used in steady state without a separate reservoir capacitor. It can thus efficiently be switched from high to low output voltage and vice versa with high efficiency, because a reservoir capacitor that needs to be discharged is not used. Instead a second multiplier working in parallel is utilized to keep the output voltage high. The second multiplier can for example be of Crockton-Walton type, but also any other diode chain circuit may as well be used. The general arrangement is depicted in FIG. 1.

The invention comprises using a parallel/series capacitor multiplying circuit 21, such as a Marx multiplier, in a one shot mode when high voltage 32 is needed, and compensating the load current and any leakage with the help of the second diode chain multiplier 22, such as a Cockcroft-Walton multiplier or similar, operating constantly through diode 102. In the invented circuit any remaining charge in the capacitors of the multiplier 21 is saved and available for the next output pulse. This will reduce the total power consumption from the input source 31.

The second multiplier 22 can work at optimum frequency for high efficiency, and its capacitors can be quite small, whereby any lost charge is of little consequence. Ripple and output regulation need not be overly considered, only efficiency, because the comparatively high capacitances of the parallell/series voltage multiplier 21 will smooth out voltage ripple caused by the pulsating current coming from the diode chain multiplier 22.

Characteristic features of the present invention are in detail presented in the enclosed claims.

The primary intended use is as a high voltage source for displays, where the not insignificant parasitic capacitance 103 of the display itself contains a charge too. This charge will also be recovered when using the invented circuit, because this charge will be connected in parallell with the capacitors of the paralle/serial multiplier 21 in the charging phase, when its capacitors are connected in parallel. Previously inductances have been used for the charge recovery, see for example Sang-Kyoo Han et al in Electronics Letters Vol. 38 No. 15 of 18 Jul. 2002, with title "Energy-recovery Circuit for Plasma Display Panel".

Another important use of the invention is to generate programming voltages needed for non-volatile memories, and for use in non-contact cards and wireless sensing equipment.

The increased battery life of the invented circuit is of importance for handheld and other small electronic devices. An advantage is that the components of the invention can be implemented using CMOS processes, and the number of necessary discrete components can be made low.

BRIEF DESCRIPTION OF THE DRAWINGS

In the following, the invention will be described in more detail with reference to the appended drawings, in which:

FIG. 1 presents a block diagram of a voltage multiplying circuit according to the present invention;

FIG. 2 depicts a basic diode based voltage multiplier stage;

FIG. 3 depicts a basic Cockcroft-Walton multiplier;

FIG. 4 depicts a multi phase diode-chain multiplier;

DETAILED DESCRIPTION OF PREFERRED EMBODIMENTS

Figure 5:
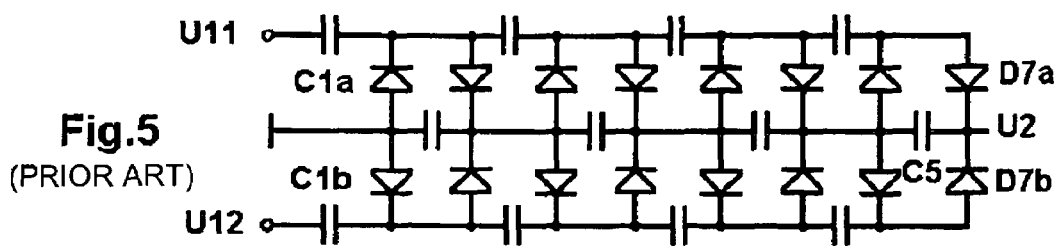
FIG. 5 depicts a multi phase multiplier.
Figure 6:
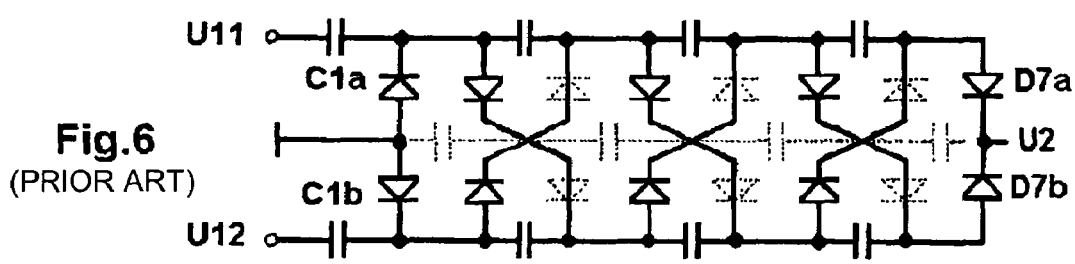
FIG. 6 depicts a simplified multiplier.
Figure 7:
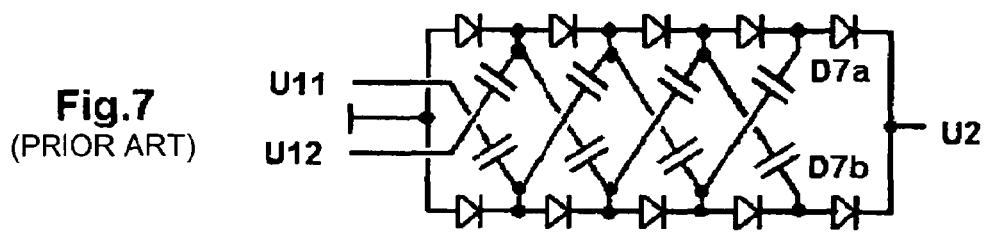
FIG. 7 depicts a simplified multiplier.
Figure 8:
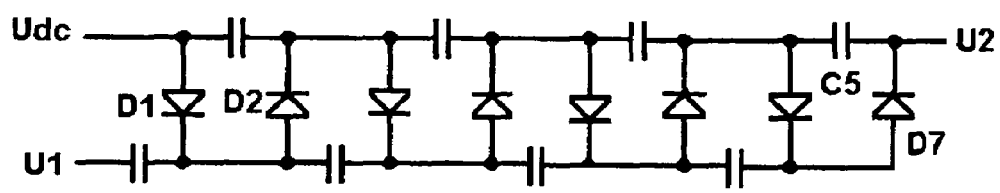
FIG. 8 depicts a way to increase output voltage.
Figure 9:
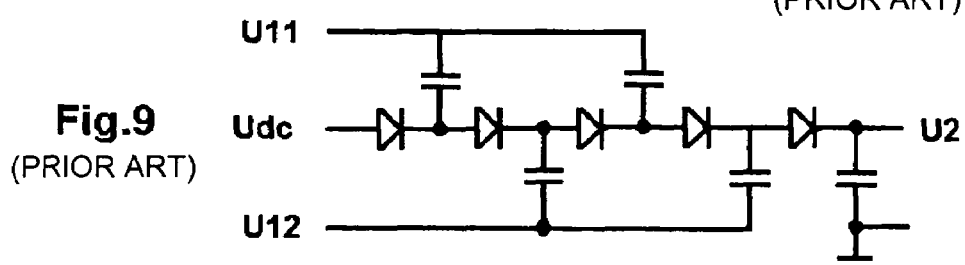
FIG. 9 depicts a parallel controlled diode chain multiplier.
Figure 10A:
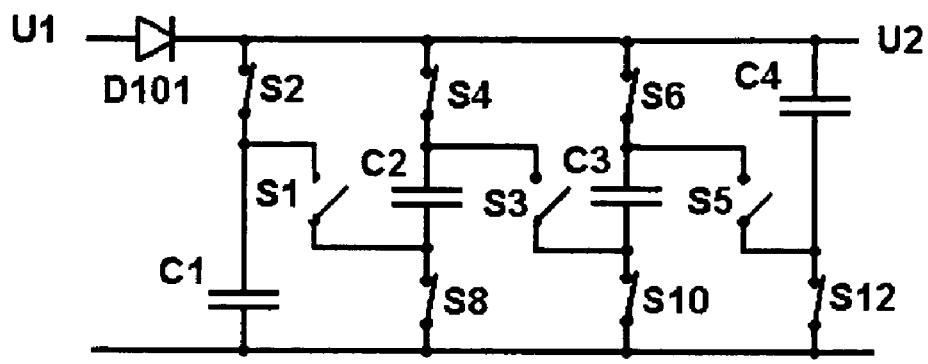
FIG. 10 illustrates the operation of a parallell/series multiplier.
Figure 10B:
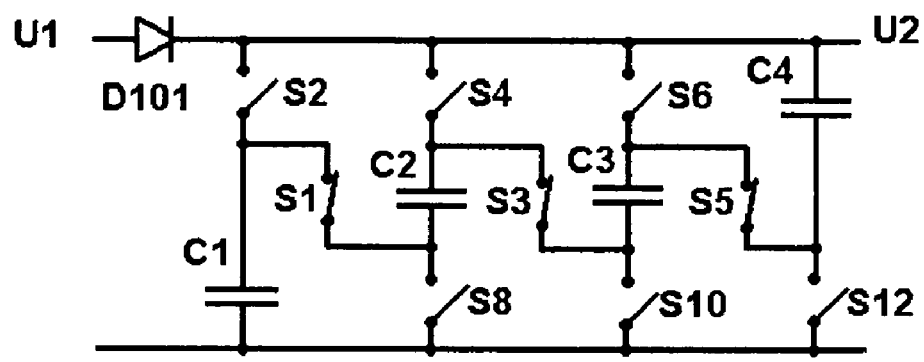

FIGS. 2 to 9 have already been explained above and examplifies the known circuits that can be used as the second multiplier 22 of the invention. This multiplier 22 can have the configuration and number of stages that is most suitable to be used with the operational load and the operational use of the multiplier 21. FIG. 10 illustrates the operation of a parallel/series switched capacitor multiplier that can be used as the first multiplier 21 of the invention. The operation of this circuit has also already been explained, but it its should be pointed out that the number of capacitors C1, C2 . . . Cn can vary from two to any number n.

The invention is best explained with reference to the block diagram shown in FIG. 1 and the example circuit depicted in FIG. 11, which shows a voltage multiplier for generating voltage pulses, up to 100 V, for displays, non-volatile memories and corresponding units in small electronic devices, such as handheld telecommunication or corresponding terminals, whereby said voltage multiplier comprises:

a serial/parallel multiplier circuit 21 comprising diode 101 and capacitors 11,12 and 13 and switches 1 . . . 8;

a diode chain multiplier 22 comprising diodes 41, 42, 43 and 102 and capacitors 51, 52 and 53; and a controlling circuit 23 providing the supply and load currents 31, 32 and controlling the multiplier 22 with the control inputs 61 and 62 and controlling the multiplier 21 by operating the switches 1 . . . 8. Additionally the output 32 is connected to an input of the controller 23 whenever a voltage feedback signal is needed to adjust the operation of the controller.

Typically the controller 23 is a part of the terminal electronics and receives supply, timing and the high voltage activating command from this circuit. The controller operates the inputs 61, 62 of the multiplier 22 typically in antiphase fashion at an advantageously high switching rate, making the use of small capacitors C1, C2 and C3 possible, but without introducing excessive switching losses because of unnecessary high switching frequency. In addition the controller 23 operates the multiplier 21 switch sets, here the even and the odd numbered switch sets, to activate the one-shot high voltage pulse with the odd numbered switch set and to facilitate recharging by operating the even numbered switch set.

In operation the multiplier 21 is operated in one-shot steady state mode without the need for a separate reservoir capacitor and it can be switched from the high to low output voltage and vice versa with high efficiency at any time. The second multiplier 22 working in parallel is in continuously operated when high voltage is needed, in order to augment a one-shot high voltage pulse generated by the multiplier 21.

The second multiplier 22 is a diode chain circuit that generates a steady high voltage current and continuously operates for the duration of the output pulse. The load 103 is typically not an ideal capacitor. Leakage currents will flow from to ground so some charge is lost during the active control pulse duration. The load can also comprise other circuitry needing continuous high voltage current. To overcome this leakage or load current, the second diode-chain multiplier 22 is connected in parallel with the first switched serial/parallel capacitor multiplier 21 to the load 103. This second diode-chain multiplier 22 can use a high switching frequency for the pump capacitors and consequently need only comparatively small capacitances, suitable for integration.

Figure 11:
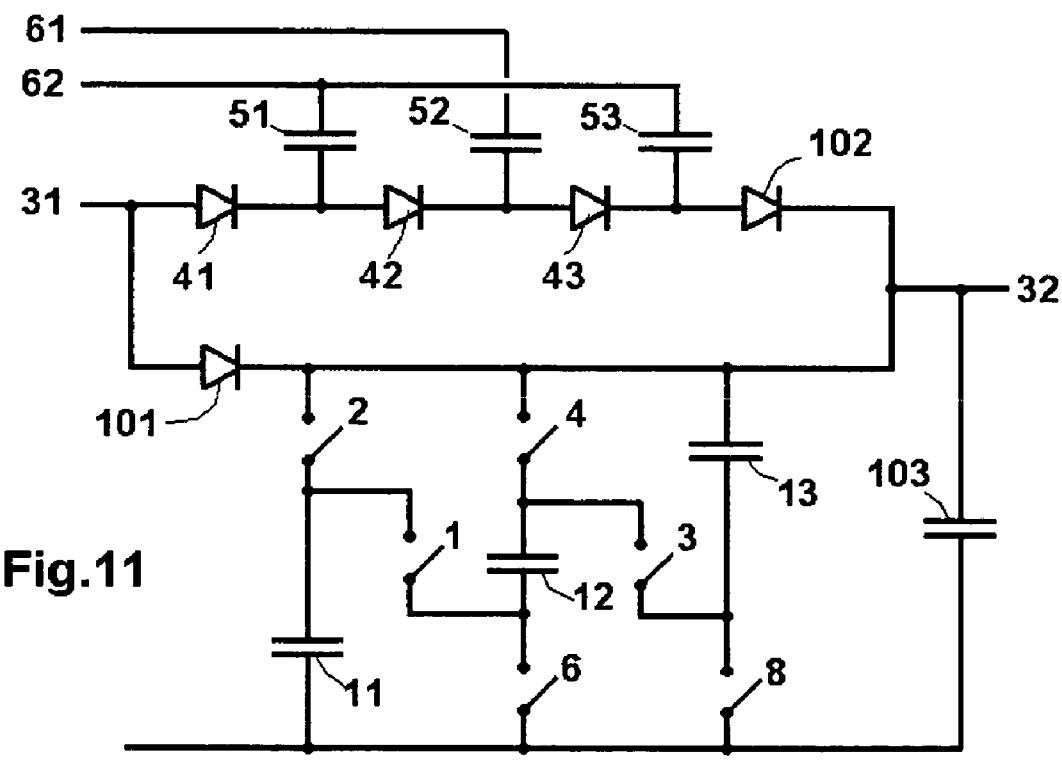
FIG. 11 shows a voltage multiplying circuit according to the invention.

The input diode 101 in FIG. 1 and FIG. 11 makes it possible that the initial charging voltage of the pump capacitors of the switched capacitor multiplier 21 can be higher than the incoming supply voltage 31. The output diode 102, or the combination of two diodes like D7a and D7b in FIG. 5 and FIG. 6 will prevent leakage of charge to the diode-chain multiplier 22, where it cannot be recovered.

It is obvious to the person skilled in the art that different embodiments of the invention are not limited to the example described above, but that they may be varied within the scope of the enclosed claims The circuit can be implemented in CMOS technology or any technology that is able to withstand the generated voltages. Further, the first voltage multiplier 21 may be of any switching capacitor circuit type suitable for use in voltage multipliers, and the second multiplier 22 can for example be of Crockton-Walton type, but also be of any other type of diode-chain multiplier circuit. Further, instead of semiconductor switches also relays or MEMS (micro electromechanical system) switches may be advantageously be used to operate at least the multiplier 21.

In the foregoing a novel method of interconnecting only slightly modified standard voltage multipliers has been presented giving numerous advantages, like decreasing the size of the needed capacitors, and enabling cost effective solutions like the use of MEMS switches, hitherto not used in voltage multipliers, to be employed in future handheld terminals.

The invention claimed is:

1. Capacitive voltage multiplier for generating voltage pulses, preferably up to 100 V, that are higher than the supply voltage for displays, non-volatile memories and corresponding units especially in small electronic devices, such as handheld telecommunication terminals or corresponding devices, wherein the multiplier comprises a switching capacitor circuit (21) coupled between input (31) and output (32) terminals of the multiplier, said switching capacitor circuit (21) provided with capacitors and switches for charging the capacitors in parallel and discharging them in series in order to deliver a high voltage pulse, characterised in that the multiplier further comprises a diode chain circuit (22) coupled between said input (31) and output (32) terminals of the multiplier, said diode chain circuit (22) comprising a diode-chain and pumping capacitors for delivering high voltage current.

2. Capacitive voltage multiplier according to claim 1, characterised in that when high voltage pulse is desired in the switching capacitor circuit (21) the series coupling switches (odd) are activated by a control pulse and all other switches (even) are opened and that in stand-by mode (no pulse) the series coupling switches (odd) are open and all other switches (even) are closed in order to charge the pump capacitors from the supply voltage, and that charge sharing will occur with the charge including the load capacitance (103).

3. Capacitive voltage multiplier according to claim 1, characterised in that the switches of the switching capacitor circuit (21) are MEMS switches.

4. Capacitive voltage multiplier according to claim 1, characterised in that the output of the switching capacitor circuit (21) is activated at the start of a control pulse.

5. Capacitive voltage multiplier according to claim 4, characterised in that an output of the switching capacitor circuit (21) is not coupled via a diode to the output terminal (32) of the multiplier so that current at the end of the control pulse can flow back into the pump capacitors, whereby the charge in the load capacitor is partly restored in the pumping capacitors.

6. Capacitive voltage multiplier according to claim 4, characterised in that the diode chain circuit (22) is continuously operated during the control pulse duration and holds the output voltage at a fixed level.

7. Capacitive voltage multiplier according to claim 1, characterised in that the diode chain circuit (22) output is through a diode (102) and that no reservoir capacitor is used.

8. Capacitive voltage multiplier according to claim 1, characterised in that a supply voltage input diode (101) is used for the switching capacitor circuit (21) allowing the initial voltage of the pump capacitors to be higher than the incoming supply voltage.

* * * * *